(12) United States Patent
Kutteruf

(10) Patent No.: US 6,910,915 B2
(45) Date of Patent: Jun. 28, 2005

(54) TERMINAL CONNECTOR

(75) Inventor: Karl-Martin Kutteruf, Neidlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/240,351

(22) PCT Filed: Jan. 31, 2002

(86) PCT No.: PCT/DE02/00344
§ 371 (c)(1),
(2), (4) Date: Feb. 21, 2003

(87) PCT Pub. No.: WO02/061885
PCT Pub. Date: Aug. 8, 2002

(65) Prior Publication Data
US 2003/0157845 A1 Aug. 21, 2003

(30) Foreign Application Priority Data
Feb. 2, 2001 (DE) .......................................... 101 04 633

(51) Int. Cl.[7] ............................................. H01R 39/00
(52) U.S. Cl. ........................ 439/504; 439/758; 439/506
(58) Field of Search ................................ 439/756, 757, 439/758, 759, 522, 726, 500–506

(56) References Cited

U.S. PATENT DOCUMENTS

| 1,959,713 A | * | 5/1934 | Goff et al. .................. 439/758 |
| 4,740,178 A | * | 4/1988 | Badenhorst et al. ........ 439/758 |
| 4,826,457 A | * | 5/1989 | Varatta ....................... 439/755 |
| 4,929,199 A | * | 5/1990 | McKinnon .................. 439/759 |
| 4,975,089 A | * | 12/1990 | Lee ............................ 439/755 |
| 5,002,508 A | * | 3/1991 | Craveiro ..................... 439/755 |
| 5,167,529 A | * | 12/1992 | Verge ......................... 439/504 |
| 6,364,719 B1 | * | 4/2002 | Chopra ....................... 439/759 |
| 6,623,314 B1 | * | 9/2003 | Cox et al. ................... 439/759 |

FOREIGN PATENT DOCUMENTS

FR 936 469 A 7/1948

* cited by examiner

Primary Examiner—Truc Nguyen
(74) Attorney, Agent, or Firm—Michael J. Striker

(57) ABSTRACT

The present invention concerns a connecting clip, in particular a connecting clip for a battery tester, which said connecting clip has a first clip half (10) and a second clip half (11), and is provided for electrically connecting a contact with a first lead (12) and a second lead (13).

It is provided, according to the invention, that the first clip half (10) has only one first contact area (14), which is provided exclusively for establishing the connection between the contact and the first lead (12), that the second clip half (11) has only one second contact area (15) that is provided exclusively for establishing the connection between the contact and the second lead (13), and that the first contact area (14) and the second contact area (15) are electrically insulated from each other.

19 Claims, 2 Drawing Sheets

TERMINAL CONNECTOR

BACKGROUND OF THE INVENTION

The present invention concerns a connecting clip, in particular a connecting clip for a battery tester, which said connecting clip has a first clip half and a second clip half and is provided for electrically connecting a contact with a first lead and a second lead.

The connecting clips according to the general class are used in conjunction with battery testers, for example. To test a battery, e.g., an automotive battery, the terminals or contacts of the battery must be connected to a load and to a measuring device by means of separate leads. When the load is known, the internal resistance of the battery can be determined by measuring voltage and current, for example, which said internal resistance is a measure of the starting power that the battery can provide. In the case of known connecting clips, the two clip halves are connected in electrically conductive fashion and form a load connection. Inside one clip half, a contact area that is electrically insulated from this clip half is provided for the measurement connection. In the case of the known exemplary embodiments of the connecting clips according to the general class, the opening angle is limited compared to a standard clip without a measurement connection. The measurement connection is difficult to connect and is often bonded or welded into the corresponding clip half in costly fashion. When the connecting clip is used, a problem often occurs, namely, there is no assurance that only the contact area for the measurement connection is contacted, and not the clip half in which is it housed. A further problem is the fact that the measurement connection and the corresponding contact area can become detached under certain load conditions or as a result of vibration.

SUMMARY OF THE INVENTION

Due to the fact that, with the connecting clip according to the invention, it is provided that the first clip half has only one first contact area that is provided exclusively for establishing the connection between the contact and the first lead, that the second clip half has only one second contact area that is provided exclusively for establishing the connection between the contact and the second lead, and that the first contact area and the second contact area are electrically insulated from each other, it can be ensured that the first lead as well as the second lead can be electrically interconnected securely with a contact, e.g., a battery terminal. Furthermore, connections, in particular adhesive connections, can be eliminated in many cases and the connecting clip can be cleaned in simple fashion, since no additional components are housed in the clip.

In the case of the connecting clip according to the invention, it is preferably further provided that the first clip half has a first section composed of an electrically conductive material, which said section forms the first contact area. In this case, a connection, in particular an adhesive connection, between the first clip half and the first contact area can be eliminated. This is advantageous because adhesive connections, in particular, have often become detached unexpectedly in the case of the related art.

For the same reason, it is preferably provided in the case of the connecting clip according to the invention that the second clip half has at least one section composed of an electrically conductive material that forms the second contact area.

In the case of a preferred exemplary embodiment of the connecting clip according to the invention it is provided that the first clip half and the second clip half are interconnected by a joint. In this context, exemplary embodiments are feasible in which the first section and/or the second section do not extend up to the joint. In this case, the first section and the second section remain electrically insulated from each other, even when the joint and/or the sections of the clip halves interconnected with the joint are formed out of electrically conductive material. In this context it is feasible, for example, to produce an end section of the first clip half and an end section of the second clip half out of a plastic material in such a fashion that the joint is located in the area of this plastic material, and that the plastic sections function as grips.

In a further exemplary embodiment of the connecting clip according to the invention it is provided that the first section and the second section extend beyond the joint, and that the electrical insulation of the first section and the second section is situated in the area of the joint. For example, if the first section and the second section are formed out of a suitable metal, an exemplary embodiment of this type results in the advantage that the first clip half and the second clip half can be interconnected in stable fashion via an appropriate joint.

In this context it is preferred that the entire first clip half form the first section.

It is further preferred in this context that the entire second clip half form the second section. If the entire first clip half as well as the entire second clip half form the first and section sections, respectively, the respective clip halves can be produced as single components, preferably out of a suitable metal. This does not rule out the possibility, however, that the corresponding end sections of the clip halves are equipped with grips, which said grips can be formed out of plastic, for example.

In the case of the connecting clip according to the invention, it is preferably further provided that the strand of the first lead is welded to the first section at a first connection point, and that the strand of the second lead is welded to the second section at a second connection point. A welded joint results in very low contact resistance and good stability. Other types of connections can be used if necessary, however, such as screwed or soldered joints, for example.

It is preferably provided in conjunction with the connecting clip according to the invention that the first lead is provided for connecting a load. In the case of a load of this type, it can be a load mentioned intially, for example, that is connected to determine the internal resistance of a battery.

In conjunction with the connecting clip according to the invention, it is preferably further provided that the second lead is provided for performing a current and/or voltage measurement. This applies in particular when the first lead is provided for connecting a load, and the connecting clip according to the invention is to be used with a battery tester.

The connecting clip according to the invention preferably has preload means as well, which said preload means preload the first contact area and the second contact area toward each other, as is known per se.

In the case of the connecting clip according to the invention, it can further be provided that the joint is a pivot joint that includes a bolt, around which the first clip half and/or the second clip half can pivot. The joint can be formed, for example, by the mentioned bolt and appropriate bore holes in the clip halves.

In the case of the connecting clip according to the invention it is preferably provided that the preload means are located in the area of the joint.

In this context in particular, it can further be provided in the case of the connecting clip according to the invention that the preload means are formed by a coil spring that is located around the bolt, at least in sections. In particular, when the entire first clip half forms the first section and the entire second clip half forms the second section, or when the first section and the second section extend beyond the joint, it is preferably provided with the connecting clip according to the invention that insulation material is located between the preload means and the bolt and/or between the preload means and the first clip half and/or the second clip half and/or between the bolt and the first clip half and/or the second clip half. Insulation material of this nature—which can also be present in multiple plies—can be formed out of a suitable plastic, for example. The insulation material functions in particular to electrically insulate the first section from the second section.

In this context, it can be further provided with the connecting clip according to the invention that insulation material extends coaxially with the bolt, at least in sections. This applies in particular for the case in which preload means are located at least partially around the bolt, whereby, in a case of this nature, the insulation material can be located between the bolt and the preload means.

In the case of certain exemplary embodiments of the connecting clip according to the invention it is provided that the preload means have a first exposed end and a second exposed end, and that the first exposed end bears against the first clip half, while the second exposed end bears against the second clip half. An exemplary embodiment of this type is considered, in particular, when the preload means are formed by a coil spring, in particular by a coil spring through which a bolt extends, which said bolt is a component of the joint. In this case, the spring force is transferred via the first exposed end and the second exposed end of the coil spring to the first clip half and the second clip half preferably in such a fashion that the first contact area and the second contact area are preloaded toward each other.

In a particularly preferred exemplary embodiment of the connecting clip according to the invention it is further provided that the first lead and the second lead are interconnected behind the clip in electrically insulated fashion by connecting means. An exemplary embodiment of this type prevents the connecting clip according to the invention from becoming interlocked with multiple cables when it is pulled through them, since the first lead and the second lead and, therefore, the entire connecting clip, move along between the other cables in the manner of a wedge, at least when a tensile load is applied. Without being limited to this, connecting means to be considered include one or more plastic rings or sleeves, for example, that form a type of press fit when slid over the first lead and the second lead.

When the aforementioned connecting means are provided in particular, it is further provided with the connecting clip according to the invention that the first lead extends out of an end section of the first clip half forming a first grip, and the second lead extends out of an end section of the second clip half forming a second grip. The first and second leads preferably extend outward in such a fashion that they are at least substantially prevented from becoming interlocked with other cables.

Every application of a connecting clip according to the invention with a battery tester is included in the scope of protection of the associated claims.

BRIEF DESCRIPTION OF THE DRAWINGS

The invention will be explained in greater detail below with reference to the associated drawings.

DESCRIPTION OF THE PREFERRED EMBODIMENTS

Figure 1:
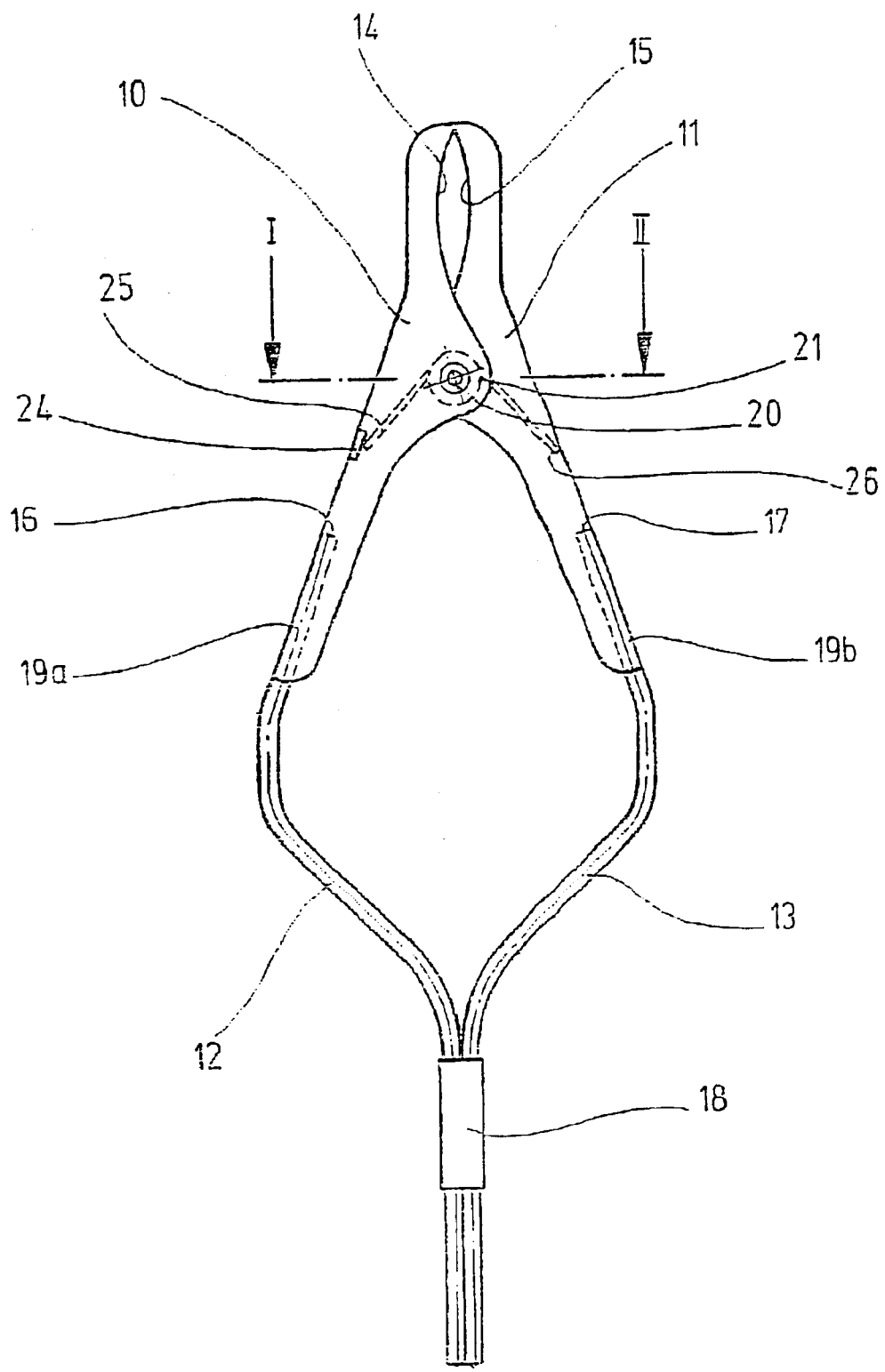
FIG. 1 shows a top view of an exemplary embodiment of the connecting clip according to the invention.

FIG. 1 shows a connecting clip for a battery tester, whereby the connecting clip has a first clip half 10 and a second clip half 11. The first clip half 10 and the second clip half 11 are provided for electrically interconnecting a contact in the form of a battery terminal with a first lead 12 and a second lead 13. The first clip half 10 forms a first contact area 14, which is provided exclusively for establishing the connection between the battery terminal and the first lead 12. In a similar fashion, the second clip half 11 forms a second contact area 15, which is provided exclusively for establishing the connection between the battery terminal and the second lead 13. The first contact area 14 and the second contact area 15 are electrically insulated from each other. In the case shown, the first clip half 10 is produced entirely out of electrically conductive material, so that this material also forms the first contact area 14. In similar fashion, the second clip half 11 is produced entirely out of electrically conductive material, so that this material also forms the second contact area 15. The first clip half 10 and the second clip half 11 are interconnected by a joint 20, whereby the design of the joint 20 is explained in detail hereinafter with reference to FIG. 2. The strand of the first lead 12 is welded at a first connection point 16 to the first section formed by the first clip half 10. In similar fashion, the strand of the second lead 13 is welded at a second connection point 17 to the second section formed by the second clip half 11. The first lead 11 is provided for connecting a load, which load is connected between the two battery terminals with the aid of a second connecting clip according to the invention. The second lead 13 is provided for performing a current or voltage measurement, whereby this measurement is carried out with the aid of the second connecting clip according to the invention between the battery terminals. The connecting clip shown has preload means 21 in the form of a coil spring 21 that preloads the first contact area 14 and the second contact area 15 toward each other. The coil spring 21 has a first exposed end section 25 and a second exposed end section 26, whereby the first exposed end section 25 bears against the first clip half 10 via an insulation material 24, while the second exposed end 26 bears against the second clip half 11. In the case shown, the first lead 12 and the second lead 13 are interconnected in electrically insulated fashion behind the connecting clip by connecting means 18. The connecting means 18 are formed by a sleeve slid over the first lead 12 and the second lead 13, which said sleeve can be made of plastic, for example. Further down, i.e., on the side of the sleeve 18 furthest away from the connecting clip, the first lead 12 and the second lead 13 are interconnected, e.g., in the fashion of a double-conductor cable. The first lead 12 extends out of the end section of the first clip half 10 forming a first grip 19a, while the second lead 13 extends out of the end section of the second clip half 11 forming a second grip 19b. This type of extension of the first lead 12 and the second lead 13 makes it possible, in conjunction with the sleeve 18, that the connecting clip according to the invention can be pulled between numerous other cables without becoming interlocked with them.

Figure 2:
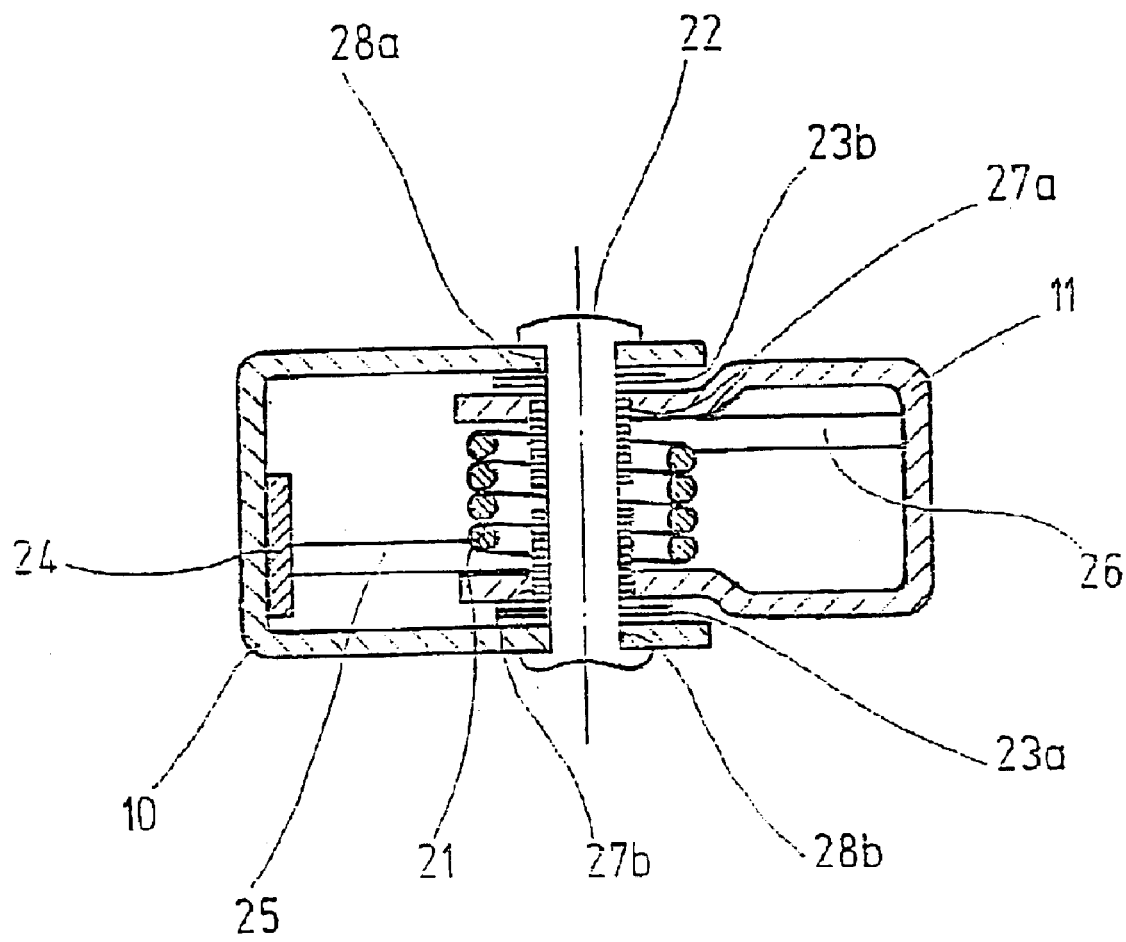
FIG. 2 shows a side sectional drawing (along the line of cut I–II in FIG. 1) of the joint of the connecting clip in FIG. 1.

FIG. 2 shows a side sectional drawing—along the line of cut I–II—of the joint of the connecting clip in FIG. 1. In the case shown, the joint is formed by bore holes 28a, 28b provided in the first clip half 10, bore holes 27a, 27b provided in the second clip half 11, and a bolt 22 guided through the bore holes 27a, 27b, 28a, 28b. A pivot joint 20 is therefore formed, by means of which the first clip half 10 and the second clip half 11 can pivot around the bolt 22. The preload means are formed by the coil spring 21, which is located around the bolt 22 in sections. The coil spring 21 has a first end section 25 that bears against the first clip half 10. Furthermore, the coil spring 21 has a second end section 26 that bears against the second clip half 11. Insulation material 23 is located between the bolt 22 and the section of the coil spring 21 arranged around said bolt, which said insulation material is located coaxially with the bolt 22. The insulation material 23 is shaped in such a fashion that it has sections extending radially toward the bolt 22 in order to prevent and electrical contact between the first clip half 10 and the second clip half 11. To prevent this undesired electrical contact between the first clip half 10 and the second clip half 11 from taking place via the coil spring 21, the first end section 25 of the coil spring 21 bears against the first clip half 10 via further insulation material 24.

In the case of the exemplary embodiment shown in the figures, the first clip halves and the second clip halves essentially have the same geometry, whereby one of the clip halves is shaped in the area of the joint. The insulation material 23 can be formed by two sleeves 23a, 23b, each of which has a collar-like, radially-extending extension on one end section, which said extension is used to provide the mutual insulation between the first clip half 10 and the second clip half 11 described hereinabove.

The preceding description of the exemplary embodiments according to the present invention is intended for illustration purposes only and is not intended to limit the invention. Various changes and modifications are possible within the framework of the invention without leaving the scope of the invention or its equivalents.

What is claimed is:

1. A connecting clip, in particular a connecting clip for a battery tester, which said connecting clip has a first clip half (10) and a second clip half (11) interconnected by a joint (20), and is provided for electrically connecting a contact with a first lead (12) and a second lead (13),
   wherein the first clip half (10) has only one first contact area (14), which is provided exclusively for establishing the connection between the contact and the first lead (12), whereby the second clip half (11) has only one second contact area (15) that is provided exclusively for establishing the connection between the contact and the second lead (13), and
   whereby the first contact area (14) and the second contact area (15) are electrically insulated from each other
   the first lead (12) and the second lead (13) are connected behind the connecting clip in electrically insulated fashion by connecting means (18)
   the first lead extends out of the end section of the first clip half (10) forming a first grip (19a), and
   the second lead (13) extends out of the end section of the second clip half (11) forming a second grip (19b),
       wherein the first clip half (10) has at least one first section composed of an electrically conductive material and forms the first contact area (14), and
       wherein the first section does not extend up to the joint (20).

2. The connection clip according to claim 1, wherein the second clip half (11) has at least one second section composed of an electrically conductive material and forms the second contact area (15).

3. The connecting clip according to claim 1, wherein the entire first clip half (10) forms the first section.

4. The connecting clip according to claim 1, wherein the first lead (12) is provided for connecting a load.

5. The connecting clip according to claim 1, wherein the second lead (13) is provided for performing a current and/or a voltage measurement.

6. The connecting clip according to claim 1, wherein probed means (21) are provided that preload the first contact area (14) and the second contact area (15) toward each other.

7. The connecting clip according to claim 1, wherein the joint (20) is a pivotal joint (20) that includes a bolt (22) around which the first dip half (10) and/or the second clip half (11) can pivot.

8. The connecting clip according to claim 1, wherein insulating material (23) extends coaxially with the bolt (22), at least in sections.

9. The connecting clip according to claim 1, wherein the preload means (21) have a first exposed end (25) and a second exposed end (26), and wherein the first exposed end (25) bears against the first dip half (10), while the second exposed end (26) bears against the second clip half (11).

10. The connecting clip according to claim 1, wherein the first lead (12) and the second lead (13) are interconnected behind the connecting flip in electrically insulated fashion by connecting means (18).

11. The connecting clip according to claim 1, wherein the first lead extends out of the second section of the first clip half (10) forming a first grip (19a), and wherein the second lead (13) extends out of the end section of the second clip half (11) forming a second grip (19b).

12. The connecting clip according to claim 2, wherein the second section does not extend up to the joint (20).

13. The connecting clip according to claim 2, wherein the first section and the section extend beyond the joint (20), and wherein the electrical insulation of the first section and the second section is situated in the area of the joint (20).

14. The connecting clip according to claim 2, wherein the entire second clip half (11) forms the second section.

15. The connecting clip according to claim 2, wherein a strand of the first lead (12) is welded to the first section at a first connection point (16), and wherein a strand of the second lead (13) is welded to the second section at a second connection point (17).

16. The connecting clip according to claim 6, wherein the preload means (21) are located in the area of the joint (20).

17. The connecting clip according to claim 6, wherein the preload means (21) are formed by a coil spring (21) that is located around the bolt (22), at least in sections.

18. The connecting clip according to claim 6, wherein insulating material (23, 24) is located between the preload means (21) and the bolt (22), and/or between the preload means (21) and the first clip half (10) and/or the second clip half (11), and/or between the bolt (22) and the second clip half (10) and/or the second clip half (11).

19. A battery tester including a connecting clip, which has a first clip half (10) and a second clip half (11) interconnected by a joint (20), and is provided for electrically connecting a contact with a first lead (12) and a second lead (13),
   wherein the first clip half (10) has only one first contact area (14), which is provided exclusively for establishing the connection between the contact and the first lead (12), whereby the second clip half (11) has only one second contact area (15) that is provided exclusively for establishing the connection between the contact and the second lead (13), and whereby the first contact area (14) and the second contact area (15) are electrically insulated from each other the first lead (12) and the second lead (13) are connected behind the connecting clip in electrically insulated fashion by connecting means (18)

the first lead extends out of the end section of the first clip half (10) forming a first grip (19*a*), and the second lead (13) extends out of the end section of the second clip half (11) forming a second grip (19*b*), wherein the first clip half (10) has at least one first section composed of an electrically conductive material and forms the first contact area (14); and wherein the first section does not extend up to the joint (20).

* * * * *